United States Patent
Kim et al.

(10) Patent No.: US 12,063,876 B2
(45) Date of Patent: Aug. 13, 2024

(54) VARIABLE RESISTANCE MEMORY DEVICE

(71) Applicant: Samsung Electronics Co., Ltd., Suwon-si (KR)

(72) Inventors: Seyun Kim, Seoul (KR); Doyoon Kim, Hwaseong-si (KR); Yumin Kim, Seoul (KR); Jinhong Kim, Seoul (KR); Soichiro Mizusaki, Suwon-si (KR); Youngjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 558 days.

(21) Appl. No.: 17/399,194

(22) Filed: Aug. 11, 2021

(65) Prior Publication Data

US 2022/0052259 A1    Feb. 17, 2022

(30) Foreign Application Priority Data

Aug. 13, 2020  (KR) .......................... 10-2020-0102054
Aug. 3, 2021   (KR) .......................... 10-2021-0102019

(51) Int. Cl.
  *H10N 70/00*  (2023.01)
  *H10B 63/00*  (2023.01)
  *H10N 70/20*  (2023.01)

(52) U.S. Cl.
  CPC ......... *H10N 70/8836* (2023.02); *H10B 63/34* (2023.02); *H10N 70/253* (2023.02);
  (Continued)

(58) Field of Classification Search
  CPC ................................ H10N 70/00; H10B 63/00
  See application file for complete search history.

(56) References Cited

U.S. PATENT DOCUMENTS 9,246,091 B1  1/2016  Wang et al.
9,246,096 B2  1/2016  Hong et al.
(Continued)

FOREIGN PATENT DOCUMENTS

EP    3843145 A1    6/2021

OTHER PUBLICATIONS

Sven Dirkmann et al. 'Filament growth and resistive switching in hafnium oxide memristive devices' *ACS Applied Materials & Interfaces*, Mar. 2018.
(Continued)

*Primary Examiner* — Marvin Payen
(74) *Attorney, Agent, or Firm* — HARNESS, DICKEY & PIERCE, P.L.C.

(57) ABSTRACT

A variable resistance memory device includes a variable resistance layer and a first conductive element and a second conductive element which are spaced apart from each other on the variable resistance layer. The variable resistance layer may include a first layer and a second layer on the first layer. The first layer includes a ternary or more metal oxide containing two or more metal materials having different valences. The second layer may include silicon oxide. The variable resistance memory device may have a wide range of resistance variation due to the metal oxide in which oxygen vacancies are easily formed. The first conductive element and the second conductive element, in response to an applied voltage, may be configured to form a current path in a direction perpendicular to a direction in which the first layer and the second direction are stacked.

27 Claims, 25 Drawing Sheets

(52) U.S. Cl.
CPC ....... *H10N 70/826* (2023.02); *H10N 70/8833* (2023.02); *H10B 63/84* (2023.02)

(56) References Cited

U.S. PATENT DOCUMENTS

| | | |
|---|---|---|
| 9,978,938 B2 | 5/2018 | Trinh et al. |
| 2012/0268980 A1 | 10/2012 | Awaya et al. |
| 2013/0328005 A1 | 12/2013 | Shin et al. |
| 2014/0145137 A1 | 5/2014 | Ju et al. |
| 2020/0203430 A1 | 6/2020 | Lee et al. |
| 2021/0202833 A1 | 7/2021 | Kim et al. |
| 2021/0257409 A1 | 8/2021 | Han et al. |

OTHER PUBLICATIONS

Extended European Search Report dated Jan. 31, 2022, issued in corresponding European Patent Application No. 21190578.1.

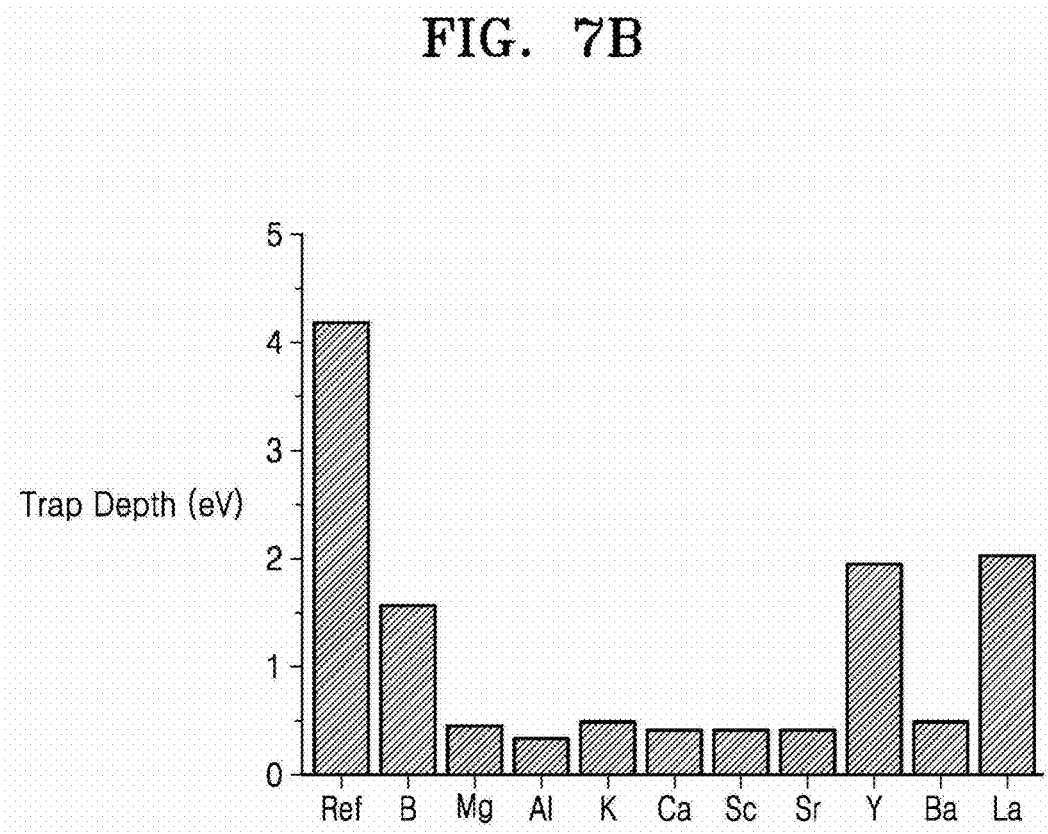

VARIABLE RESISTANCE MEMORY DEVICE

CROSS-REFERENCE TO RELATED APPLICATION

This application is based on and claims priority under 35 U.S.C. § 119 to Korean Patent Applications No. 10-2020-0102054, filed on Aug. 13, 2020 and No. 10-2021-0102019, filed on Aug. 3, 2021, in the Korean Intellectual Property Office, the disclosure of which is incorporated by reference herein in its entirety.

BACKGROUND

1. Field

One or more embodiments relate to non-volatile memory devices including variable resistance materials.

2. Description of Related Art

A non-volatile memory device is a semiconductor memory device capable of retaining stored data even when power supply is terminated. Examples of a non-volatile memory device include programmable read only memory (PROM), erasable PROM (EPROM), electrically EPROM (EEPROM), and flash memory device.

Recently, according to the technical demands for high integration and low power consumption characteristics and random access to memory cells, next generation semiconductor memory devices such as magnetic random access memory (MRAM) and phase-change random access memory (PRAM) have been developed.

Such next generation semiconductor devices may include variable resistance elements whose resistance values vary with an electric current or a voltage applied thereto. The variable resistance elements may have characteristics of maintaining the varied resistance values even when electric current or voltage supply is cut off. In order to obtain high integration and low power consumption, resistance variation characteristics of the variable resistance element may occur at a low application voltage and a range of resistance variation may be wide.

SUMMARY

Provided are variable resistance memory devices with improved variable resistance performance.

Additional aspects will be set forth in part in the description which follows and, in part, will be apparent from the description, or may be learned by practice of the presented embodiments of the disclosure.

According to an embodiment, a variable resistance memory device includes a variable resistance layer, a first conductive element on the variable resistance layer, and a second conductive element on the variable resistance layer and spaced apart from the first conductive element. The variable resistance layer includes a first layer and a second layer on the first layer, where the first layer includes a ternary or more metal oxide containing two or more metal materials having different valences, and the second layer includes an oxide. The first conductive element and the second conductive element, in response to an applied voltage, may be configured to form a current path in a direction perpendicular to a direction in which the first layer and the second layer are stacked.

In some embodiments, the first conductive element and the second conductive element may contact the second layer.

In some embodiments, the second layer may include a silicon oxide.

In some embodiments, the metal oxide may include Rb, Ti, Ba, Zr, Ca, Hf, Sr, Sc, B, Mg, Al, K, Y, La, Si, Be, Nb, Ni, Ta, W, V, La, Gd, Cu, Mo, Cr, or Mn.

In some embodiments, the metal oxide may be represented by $(M1)_x(M2)_yO_z$, M1 and M2 may each be a metal element, a valance of M1 may be greater than that of M2, and $x \geq y$ may be satisfied.

In some embodiments, the metal oxide may include Al—Ti—O, Hf—Al—O, Hf—Mg—O, Hf—K—O, Hf—Ca—O, Hf—Sc—O, Hf—Sr—O, Hf—Ba—O, Hf—B—O, Hf—Y—O, Hf—La—O, Al—Zr—O, Al—Si—O, Mg—Si—O, Mg—Zr—O, Zr—Nb—O, Hf—Nb—O, or Hf—Ta—O.

In some embodiments, the metal oxide may be Hf—Al—O, Hf—Mg—O, Hf—K—O, Hf—Ca—O, Hf—Sc—O, Hf—Sr—O, or Hf—Ba—O.

In some embodiments, the two or more metal materials included in the metal oxide may be selected so that a trap depth of the variable resistance layer is less than 1 eV.

In some embodiments, a thickness of the first layer may be less than or equal to about 100 nm.

In some embodiments, the thickness of the first layer may be in a range of about 1 nm to about 10 nm.

In some embodiments, a thickness of the second layer may be less than or equal to about 5 nm.

According to an embodiment, a variable resistance memory device may include an insulating layer; a variable resistance layer on the insulating layer; a channel layer on the variable resistance layer; a gate insulating layer on the channel layer; and a plurality of gate electrodes and a plurality of insulators which are alternately and repeatedly disposed on the gate insulating layer in a first direction parallel to the channel layer. The variable resistance layer may include a first layer and a second layer on the first layer. The first layer may include a ternary or more metal oxide containing two or more metal materials having different valences. The second layer may include an oxide.

In some embodiments, the second layer may be in contact with the channel layer, and the oxide included in the second layer may be an oxide of a material of the channel layer.

In some embodiments, the channel layer may include a polysilicon (poly-Si) material, and the second layer may include a silicon oxide.

In some embodiments, the metal oxide may include Rb, Ti, Ba, Zr, Ca, Hf, Sr, Sc, B, Mg, Al, K, Y, La, Si, Be, Nb, Ni, Ta, W, V, La, Gd, Cu, Mo, Cr, or Mn.

In some embodiments, the metal oxide may be represented by $(M1)_x(M2)_yO_z$, M1 and M2 may each be a metal element, a valance of M1 may be greater than a valance of M2, and x y may be satisfied.

In some embodiments, the metal oxide may include Al—Ti—O, Hf—Al—O, Hf—Mg—O, Hf—K—O, Hf—Ca—O, Hf—Sc—O, Hf—Sr—O, Hf—Ba—O, Hf—B—O, Hf—Y—O, Hf—La—O, Al—Zr—O, Al—Si—O, Mg—Si—O, Mg—Zr—O, Zr—Nb—O, Hf—Nb—O, or Hf—Ta—O.

In some embodiments, the metal oxide may be Hf—Al—O, Hf—Mg—O, Hf—K—O, Hf—Ca—O, Hf—Sc—O, Hf—Sr—O, or Hf—Ba—O.

In some embodiments, the two or more metal materials included in the metal oxide may be selected so that a trap depth of the variable resistance layer is less than 1 eV.

In some embodiments, a thickness of the first layer may be less than or equal to about 100 nm.

In some embodiments, the thickness of the first layer may be in a range of about 1 nm to about 10 nm.

In some embodiments, the thickness of the second layer may be less than or equal to about 5 nm.

In some embodiments, the insulating layer may have a cylindrical shape extending in the first direction. The variable resistance layer, the channel layer, and the gate insulating layer sequentially may surround the insulating layer in a cylinder-shell shape, and the plurality of gate electrodes and the plurality of insulators may surround the gate insulating layer alternately in the first direction.

In some embodiments, a sum of lengths of a gate electrode and an insulator in the first direction, which are disposed to be adjacent to each other among the plurality of gate electrodes and the plurality of insulators, may be less than about 20 nm.

In some embodiments, the variable resistance memory device may further include a drain region and a source region contacting opposite end portions of the channel layer in the first direction, respectively.

In some embodiments, the variable resistance memory device may further include a bit line connected to the drain region, a source line connected to the source region, and a plurality of word lines connected to the plurality of gate electrodes, respectively.

According to an embodiment, a variable resistance memory device may include a substrate; a variable resistance layer on the substrate; a plurality of gate electrodes spaced apart from each other on the substrate; a channel layer on the substrate, the channel layer extending between the variable resistance layer and the plurality of gate electrodes; a gate insulating layer on the substrate and extending between the channel layer and the plurality of gate electrodes; and a source and a drain connected to variable resistance layer and being spaced apart from each other. The variable resistance layer includes a first layer and a second layer contacting the first layer. The first layer includes a metal oxide containing a first metal and a second metal having different valences from each other, and the second layer includes an oxide.

In some embodiments, the metal oxide may include at least one of Rb, Ti, Ba, Zr, Ca, Hf, Sr, Sc, Mg, Al, Si, Be, Nb, Ni, Ta, W, V, La, Gd, Cu, Mo, Cr, or Mn. The channel layer may include polysilicon (poly-Si). The second layer may include silicon oxide.

In some embodiments, the variable resistance layer may extend in a first direction parallel to an upper surface of the substrate. The channel layer may be on top of the variable resistance layer, extend in the first direction, and contact an upper surface of the variable resistance layer. The gate insulating layer may be on top of the channel layer and extends in the first direction. The plurality of gate electrodes may be spaced apart from each other in the first direction on top of the gate insulating layer.

In some embodiments, the variable resistance memory device may further include a bit line and a pillar. The bit line may be connected to the variable resistance layer through the drain and may extend in a first direction parallel to an upper surface of the substrate. The pillar may be on the upper surface of the substrate and may extend in a second direction crossing the first direction. The source may be an impurity region in the substrate below the pillar. The substrate may be a semiconductor substrate. The pillar may include the variable resistance layer, the channel layer, and the gate insulating layer extending in the second direction. The plurality of gate electrodes may surround the pillar and may be spaced apart from each other in the second direction.

In some embodiments, the metal oxide may include Al—Ti—O, Al—Hf—O, Al—Zr—O, Al—Si—O, Mg—Si—O, Mg—Zr—O, Mg—Hf—O, Zr—Nb—O, Hf—Nb—O, or Hf—Ta—O.

According to an embodiment, an electronic device includes any one of variable resistance memory devices described above.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 7A to 7C show computational simulation results for Vo formation energy, trap depth, and I-V curve for a variable resistance layer including various types of metal oxides;

DETAILED DESCRIPTION

Figure 1:
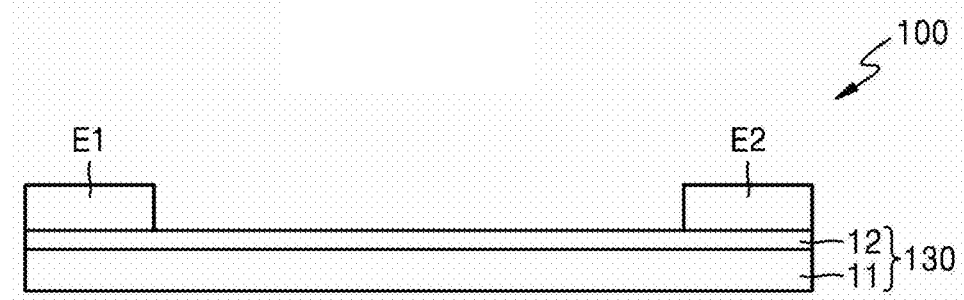
FIG. 1 is a cross-sectional view showing a schematic structure of a variable resistance memory device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, an embodiment will be described in detail with reference to the accompanying drawings. The embodiments described below are merely examples, and various modifications may be possible from the embodiments. In the drawings, like reference numerals refer to like elements throughout, and sizes of elements may be exaggerated for clarity and convenience of explanation.

It will be understood that when an element or layer is referred to as being "above" or "on" another element or layer, the element or layer may be directly on another element or layer or intervening elements or layers.

It will be understood that, although the terms "first", "second", etc. may be used herein to describe various elements, these terms are only used to distinguish one element from another element. These terms are not intended to limit differences in materials or structures of elements.

An expression used in the singular encompasses the expression of the plural, unless it has a clearly different meaning in the context. It will be further understood that the terms "comprises" and/or "comprising" used herein specify the presence of stated features or elements, but do not preclude the presence or addition of one or more other features or elements.

The term used in the embodiments such as "unit" or "module" indicates a unit for processing at least one function or operation, and may be implemented in hardware or software, or in a combination of hardware and software.

The use of "the" and other demonstratives similar thereto may correspond to both a singular form and a plural form.

With respect to operations that constitute a method, the operations may be performed in any appropriate sequence unless the sequence of operations is clearly described or unless the context clearly indicates otherwise. Also, the use of any and all examples, or language provided herein, is intended merely to better illuminate the disclosure and does not pose a limitation on the scope of the disclosure unless otherwise claimed.

Figure 2:
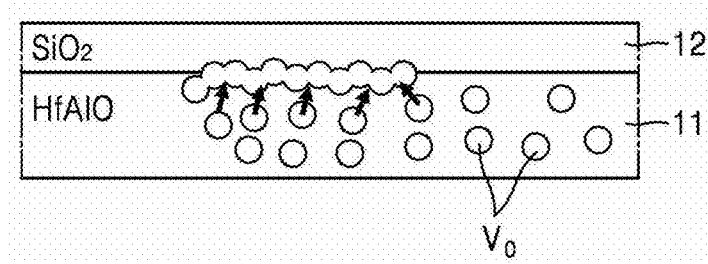
FIG. 2 is a conceptual diagram describing a principle of resistance variation occurring in a variable resistance layer provided in the variable resistance memory device of FIG. 1.

FIG. 1 is a cross-sectional view showing a schematic structure of a variable resistance memory device according to an embodiment, and FIG. 2 is a conceptual diagram describing a principle of resistance variation occurring in a variable resistance layer provided in a variable resistance memory device of FIG. 1.

Referring to FIG. 1, a variable resistance memory device 100 includes a variable resistance layer 130 including a first layer 11 and a second layer 12, and a first conductive element E1 and a second conductive element E2 for applying a voltage to the variable resistance layer 130.

The first conductive element E1 and the second conductive element E2 are disposed to contact the second layer 12 and are disposed to be spaced apart from each other on the variable resistance layer 130 to form a current path in a direction perpendicular to a direction in which the first layer 11 and the second layer 12 are stacked in the variable resistance layer 130.

The first layer 11 includes a ternary or more metal oxide containing two or more metal materials having different valances. A metal material included in a metal oxide of the first layer 11 may be at least one of Rb, Ti, Ba, Zr, Ca, Hf, Sr, Sc, B, Mg, Al, K, Y, La, Si, Be, Nb, Ni, Ta, W, V, La, Gd, Cu, Mo, Cr, or Mn. The first layer 11 may include a ternary or more metal oxide including at least two metal materials (M1 and M2) having different valences and the second layer 12 include an oxide, such as silicon oxide ($SiO_2$).

The second layer 12 may include an oxide. The second layer 12 may include a silicon oxide, but is not limited thereto. The second layer 12 may include an oxide of a material in contact with the second layer 12 in a device to which the variable resistance memory device 100 is applied.

The first conductive element E1 and the second conductive element E2 may be disposed on opposite ends of the variable resistance layer 130, and may be disposed to form a current path in a horizontal direction, that is, a direction perpendicular to a direction in which the first layer 11 and the second layer 12 are stacked, in the variable resistance layer 130 when a voltage is applied. The first conductive element E1 and the second conductive element E2 may be formed to contact opposite ends of the second layer 12.

The variable resistance layer 130 has a resistance characteristic that varies according to an applied voltage. The resistance characteristic of the variable resistance layer 130 may depend upon whether a conductive filament forms from oxygen generation in the variable resistance layer 130 in response a voltage applied to the first conductive element E1 and the second conductive element E2 formed on the variable resistance layer 130. According to whether the conductive filament is formed, the variable resistance layer 130 may represent a low-resistive state or a high-resistive state, and accordingly, information of "1" or "0" may be written. An applied voltage that changes the variable resistance layer 130 from a high-resistive state to a low-resistive state is referred to as a set voltage ($V_{set}$), and an applied voltage that changes the variable resistance layer 130 from a low-resistive state to a high-resistive state is referred to as a reset voltage ($V_{reset}$). The variable resistance memory device 100 according to an embodiment suggests a configuration of the variable resistance layer 130 which implements a low set voltage and has a large difference between resistance of a high-resistive state and resistance of a low-resistive state.

As in the embodiment, a metal oxide including two metal materials having different valences may include a plurality of oxygen vacancies $V_o$. For example, as illustrated in FIG. 2, when a metal oxide included in the first layer 11 is HfAlO that includes Hf having a valence of 4 and Al having a valence of 3, Al moves into a Hf site and an oxygen vacancy is formed at an interface between a HfAlO layer and a SiO$_2$ layer. Such atomic behavior may be represented as follows.

$$Al_2O_3 + HfO_2 \rightarrow 2Al_{Hf}^* + V_o^{**} + 3O_o^x$$

In the atomic behavior representation above, $Al_{Hf}^*$ refers to a structure in which some Al occupies a Hf site in HfO$_2$ in the structure of Al$_2$O$_3$. $V_o^{**}$ refers to a structure in which an O site is empty, and $O_o^x$ refers to a structure in which O is positioned in an O site.

The oxygen vacancies $V_o$ formed as above are gathered to form a conductive filament, and resistance of the variable resistance layer 130 is lowered by the conductive filament.

When a conductive filament is easily formed even at a low applied voltage and a difference between resistance of a low-resistive state and resistance of a high-resistive state generated by the applied voltage increases, the variable resistance performance may be excellent.

When the variable resistance layer 130 is configured as in the embodiments of the present application, such as in FIG. 1 and/or FIGS. 7 and 10 discussed below, a desired range of resistance variation may be realized with a less thickness compared to a case of using a charge trapping-based variable resistance element or a variable resistance element using a phase change material. A thickness of the first layer 11 may be less than or equal to about 100 nm or may be less than or equal to about 10 nm. A thickness of the first layer 11 may be greater than or equal to about 1 nm. A thickness of the second layer 12 may be less than or equal to about 5 nm.

As metal materials (M1 and M2) included in the metal oxide of the first layer 11, a material having a band gap energy of 2 eV or more of the oxide may be used. These materials and their valances are shown in Table 1.

TABLE 1

| Cationic component (M$_1$ and M$_2$) | Valence |
|---|---|
| Rb | +1 |
| Ti | +4 |
| Ba | +2 |
| Zr | +4 |
| Hf | +4 |
| Ca | +2 |
| Sr | +2 |
| Sc | +3 |
| Mg | +2 |
| Al | +3 |
| Si | +4 |
| Be | +2 |
| Nb | +5 |
| Ni | +2 |
| Ta | +5 |
| W | +6 |
| V | +5 |
| La | +3 |
| Gd | +3 |
| Cu | +2 |
| Mo | +6 |
| Cr | +3 |
| Mn | +4 |
| K | +3 |
| Y | +3 |
| B | +3 |

Referring to Table 1, a metal oxide (M1-M2-O) including two metal materials having different valences may be formed. A combination as shown in Table 2 may be used.

TABLE 2

| M1—M2—O |
|---|
| Al—Ti—O |
| Al—Hf—O |
| Al—Zr—O |
| Al—Si—O |
| Mg—Si—O |
| Mg—Zr—O |
| Mg—Hf—O |
| Zr—Nb—O |
| Hf—Nb—O |
| Hf—Ta—O |
| Hf—K—O |
| Hf—Ca—O |
| Hf—Sc—O |
| Hf—Sr—O |
| Hf—Ba—O |
| Hf—Y—O |
| Hf—La—O |
| Hf—B—O |

A difference between a valance of M1 and a valence of M2 may be greater than or equal to 1. Alternatively, a difference between a valance of M1 and a valence of M2 may be greater than or equal to 2. The greater the difference in valences, the more oxygen vacancies there may be, and a combination that has a difference in valences greater than 2 may be set.

A content proportion of each of M1 and M2 in a metal compound, M1-M2-O, is not particularly limited. An appropriate content ratio at which oxygen vacancies are generated as many as possible may be set. An optimum content ratio may be determined according to valences of M1 and M2, and an optimum content ratio may be determined according to a type of atom. For example, a metal oxide may be represented by $(M1)_x(M2)_yO_z$, and when M1 is a metal having a greater valance than that of M2, x≥y may be satisfied. When represented as x+y=1, x may be in a range of 0.5≤x<1 and y may be in a range of 0<y≤0.5. Alternatively, x may be in a range of 0.7≤x<1, and y may be in a range of 0<y≤0.3. However, embodiments of the disclosure is not limited thereto, and may be adjusted differently according to the type of a metal element.

Although ternary oxides including two metal materials are described above, a quaternary oxide including three metal materials having different valences may be employed in the variable resistance layer 130. For example, in a combination of M1-M2-M3-O, M1, M2, and M3 are different metal materials, and at least two metal materials among M1, M2, and M3 may have different valences. In other words, at least two of M1, M2, and M3 have different valences, and not all of M1, M2, and M3 should have different valences. In some embodiments, the first layer 11 of the variable resistance layer 130 may include a quaternary oxide.

Figure 3A:
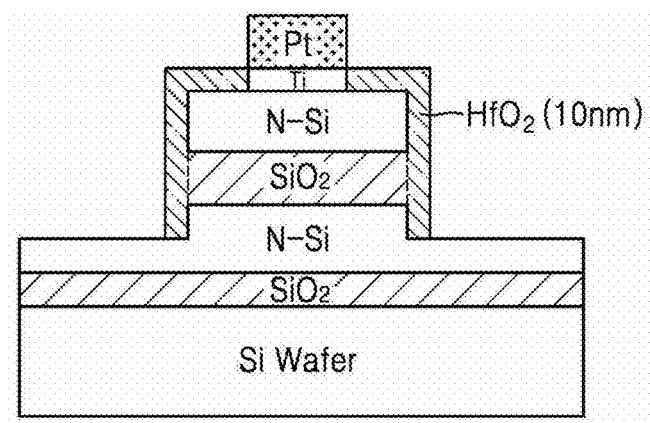
FIGS. 3A to 3C are cross-sectional views showing schematic structures of samples manufactured to test variable resistance performance of various variable resistance materials.
Figure 3B:
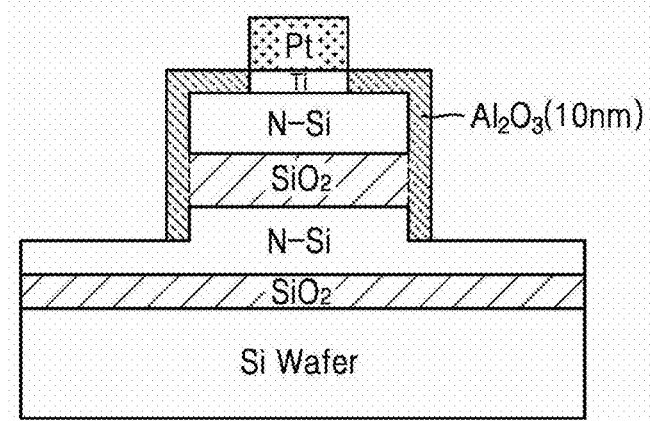
Figure 3C:
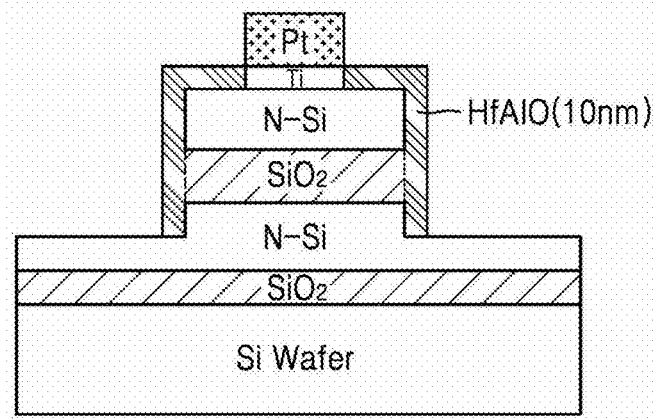
Figure 4A:
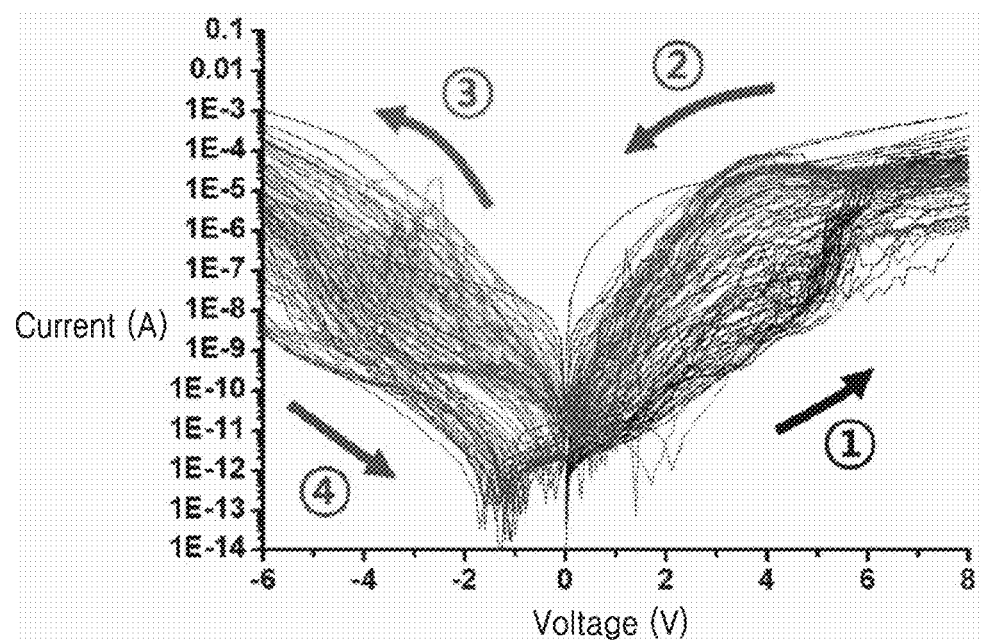
FIGS. 4A to 4C illustrate I-V curves for the samples of FIGS. 3A to 3C, respectively.
Figure 4B:
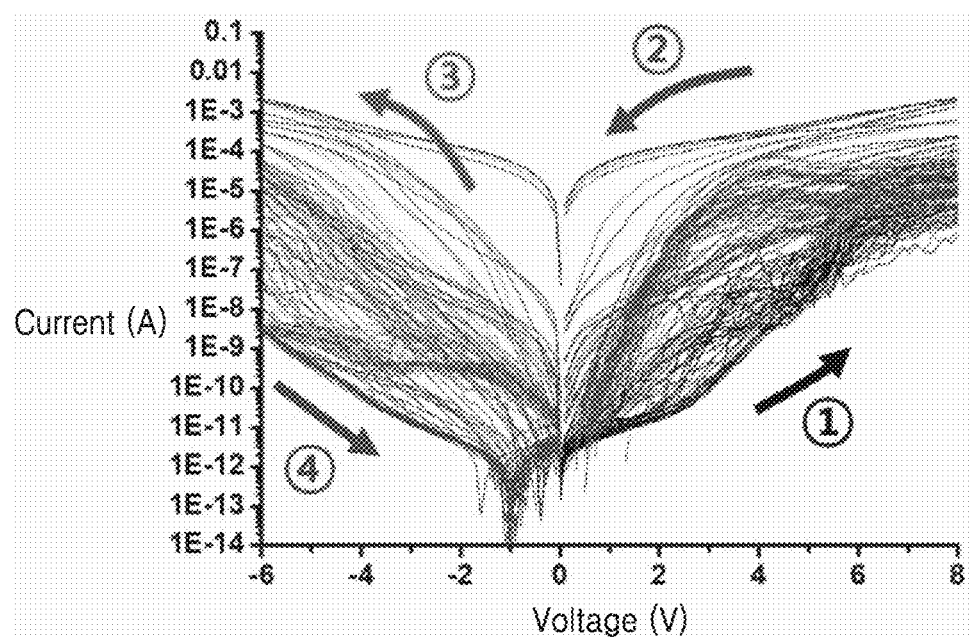
Figure 4C:
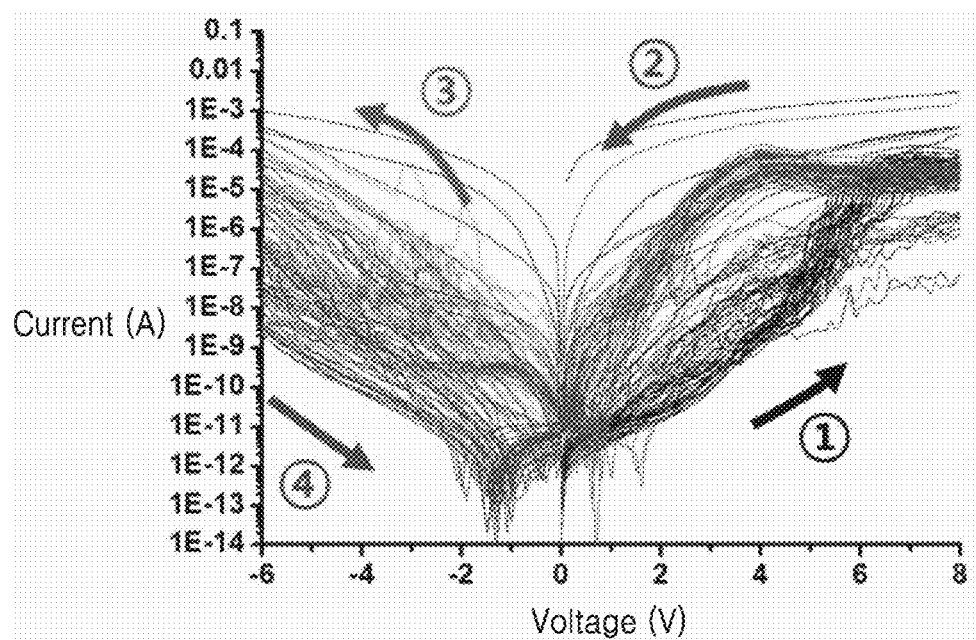

FIGS. 3A to 3C are cross-sectional views showing schematic structures of samples manufactured to test variable resistance performance of various variable resistance materials, and FIGS. 4A to 4C illustrate I-V curves for the samples of FIGS. 3A to 3C, respectively.

As described in FIG. 3A, SiO$_2$, N-type Si, SiO$_2$, and N-type Si are sequentially deposited on Si wafer, and a cylindrical structure of N—Si/SiO$_2$/N—Si is formed by using patterning and etching processes. A variable resistance material, e.g., HfO$_2$, is deposited to a thickness of 10 nm on a side surface of a cylindrical element, and when voltage is applied between an upper electrode, e.g., N—Si, and a lower electrode, e.g., N—Si, an electric current flows from the upper N—Si to the lower N—Si along a HfO$_2$/SiO$_2$ layer. In this case, Ti/Pt is deposited on the upper electrode, e.g., N—Si, to improve contact resistance between the upper electrode, N—Si, and a probe station terminal.

In FIG. 3B, $Al_2O_3$ (10 mm) is deposited as a variable resistance material on a surface of a cylindrical structure of N—Si/$SiO_2$/N—Si, and when a voltage is applied between an upper electrode, e.g., N—Si, and a lower electrode, e.g., N—Si, an electric current flows from the upper N—Si to the lower N—Si along a $Al_2O_3$/$SiO_2$ layer.

In FIG. 3C, Hf—Al—O (10 nm) is deposited as a variable resistance material on a surface of a cylindrical structure of N—Si/$SiO_2$/N—Si, and when a voltage is applied between an upper electrode, e.g., N—Si, and a lower electrode, e.g., N—Si, an electric current flows from the upper N—Si to the lower N—Si along a HfAlO/$SiO_2$ layer.

FIGS. 4A to 4C illustrates I-V curves for the samples of FIGS. 3A to 3C, respectively.

When a voltage is changed from 0 V to 8 V (step ①), a resistance state of a variable resistance material is changed from a high-resistive state (HRS) to a low-resistive state (LRS), and a voltage is lowered from 8 V to 0 V again (step ②), and a voltage is changed from 0 V to −6 V (step ③), the resistance state of the variable resistance material is changed from the LRS to the HRS. Then, a process of changing a voltage from −6 V to 0 V (step ④) is performed, thereby ending one cycle.

In order to identify a resistance variation phenomenon, resistance of the variable resistance material is read at 4 V. In this case, it may be determined that a sample when a resistance value at 4 V in the first step (①) in the HRS and a resistance value at 4 V in the second step (②) differ by a factor of 1,000 may be used as a variable resistance device.

As a result of measuring 64 samples of each of FIGS. 3A to 3C using $HfO_2$, $Al_2O_3$, and HfAlO as variable resistance materials, respectively, a yield satisfying above requirements is 39.1% for HfO2 and 37.5% for Al2O3. Resistance values of HfAlO differ by a factor of 1,000 at a yield of 64.1%.

In other words, compared to $HfO_2$ and $Al_2O_3$ used as variable resistance materials in the related art, in a case of HfAlO used as a variable resistance material in the present embodiment, the yield is increased by about 25% or more. The reason for the above case is that, since, unlike $HfO_2$ and $Al_2O_3$, which are metal oxides including only a single metal, HfAlO has two metals with different valences mixed with each other, an oxygen vacancy exists even before a voltage is applied. Such result is the same as a result that is predictable with a concept of border trap density.

Figure 5A:
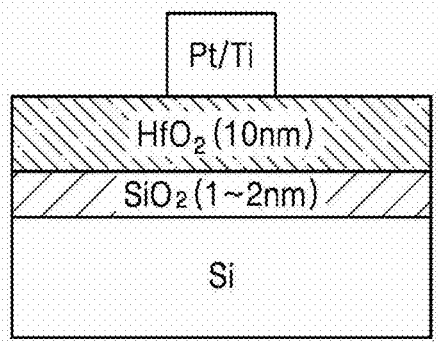
FIGS. 5A to 5C are cross-sectional views showing schematic configurations of samples manufactured to measure border trap density for the variable resistance materials of FIGS. 3A to 3C.
Figure 5B:
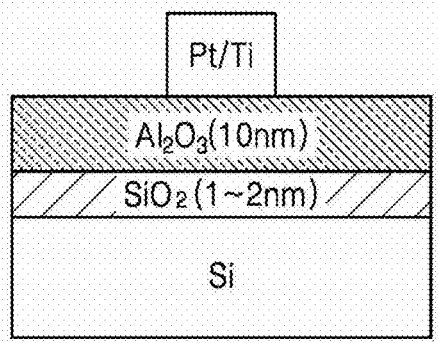
Figure 5C:
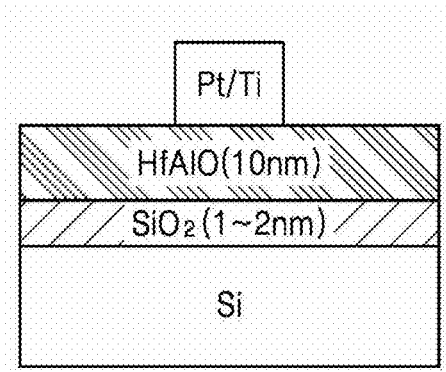
Figure 6A:
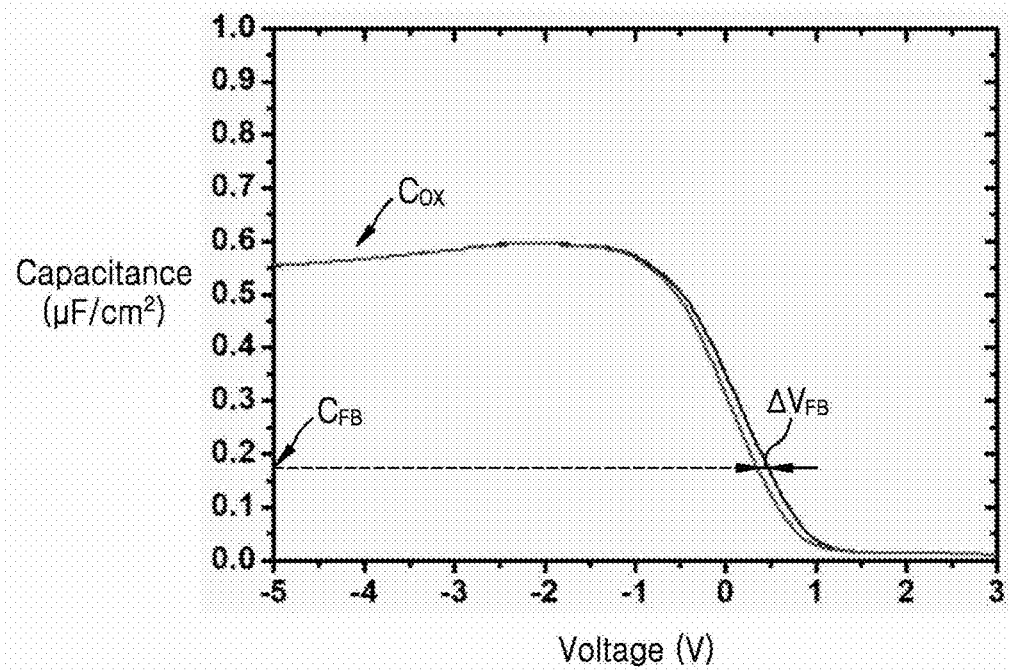
FIGS. 6A to 6C are graphs of voltage versus capacitance measured for the samples of FIGS. 5A to 5C, respectively.
Figure 6B:
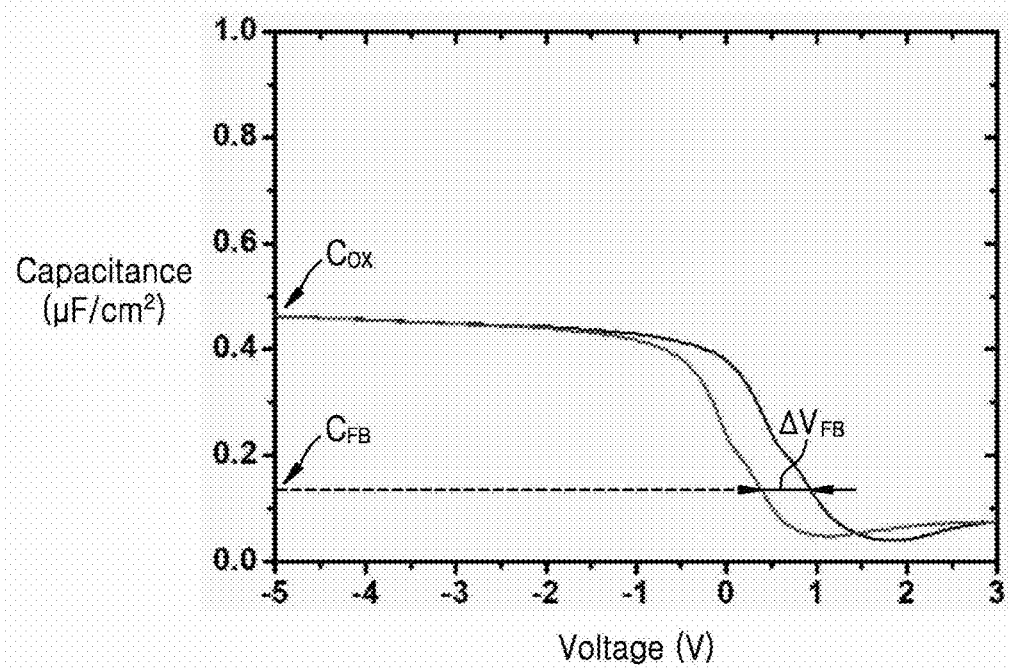
Figure 6C:
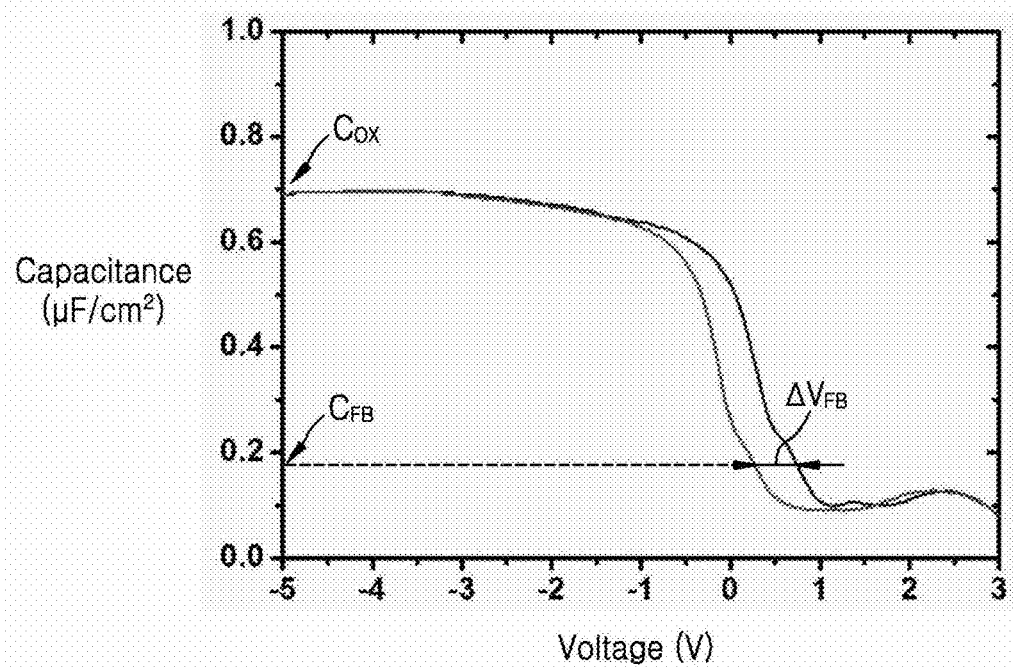

FIGS. 5A to 5C are cross-sectional views showing schematic configurations of samples manufactured to measure border trap density for the variable resistance materials of FIGS. 3A to 3C, and FIGS. 6A to 6C are graphs of voltage versus capacitance measured for the samples of FIGS. 5A to 5C, respectively.

Border trap density ($Q_{ot}$) may be obtained by using the following formulae.

$$Q_{ot} = \frac{C_{ox}\Delta V_{FB}}{qA}$$

$$\frac{1}{C_{FB}} = \frac{1}{C_{ox}} + \frac{L_D}{\varepsilon_{Si}}$$

$$L_D = \sqrt{\frac{\varepsilon_{Si}kT}{q^2 N_A}}$$

In the above formulae, $C_{ox}$ refers to oxide capacitance in accumulation, $V_{FB}$ refers to flat-band voltage, $C_{FB}$ refers to flat-band capacitance, q refers to basic quantity of electric charge, A refers to an area of an electrode, $\varepsilon_{Si}$ refers to permittivity of silicon, $L_D$ refers to Debye length, and $N_A$ refers to doping concentration. $C_{ox}$ is extracted from a capacitance graph, and $C_{ox}$ is calculated from $C_{FB}$. In the graph, an interval between two V values corresponding to the calculated $C_{FB}$ is $\Delta V_{FB}$. However, $C_{FB}$ displayed in the graph is illustratively expressed to explain $\Delta V_{FB}$, and is not an exact numerical value.

A result of calculating the border trap density from the measured capacitance graph is shown in the following table.

TABLE 3

|  | $SiO_2$/$HfO_2$ | $SiO_2$/$Al_2O_3$ | $SiO_2$/HfAlO |
|---|---|---|---|
| Yield | 39.1 % | 37.5% | 64.1 % |
| Border trap density (cm$^{-2}$) | 3.74 * 10$^{11}$ | 1.34 * 10$^{12}$ | 2.08 * 10$^{12}$ |

In Table 3, yields at which high-resistive values/low-resistive values are greater than or equal to 1,000 according to I-V curves of FIGS. 4A to 4C are shown, and $SiO_2$/HfAlO has the highest yield and the highest border trap density among the three cases. Oxygen vacancies are formed more easily and much more in an oxide in which at least two metal materials having different valences are mixed.

Figure 7A:
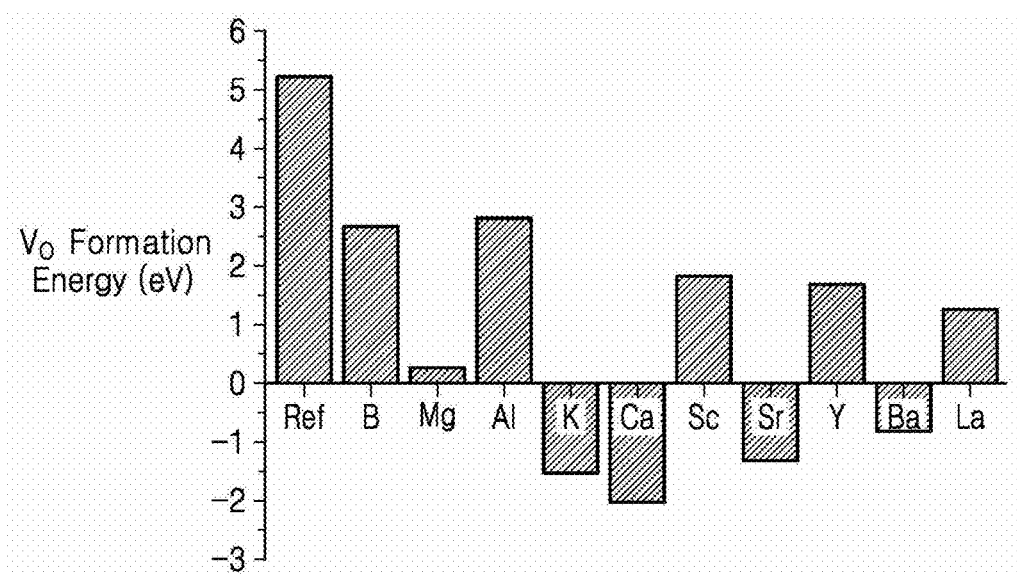
Figure 7C:
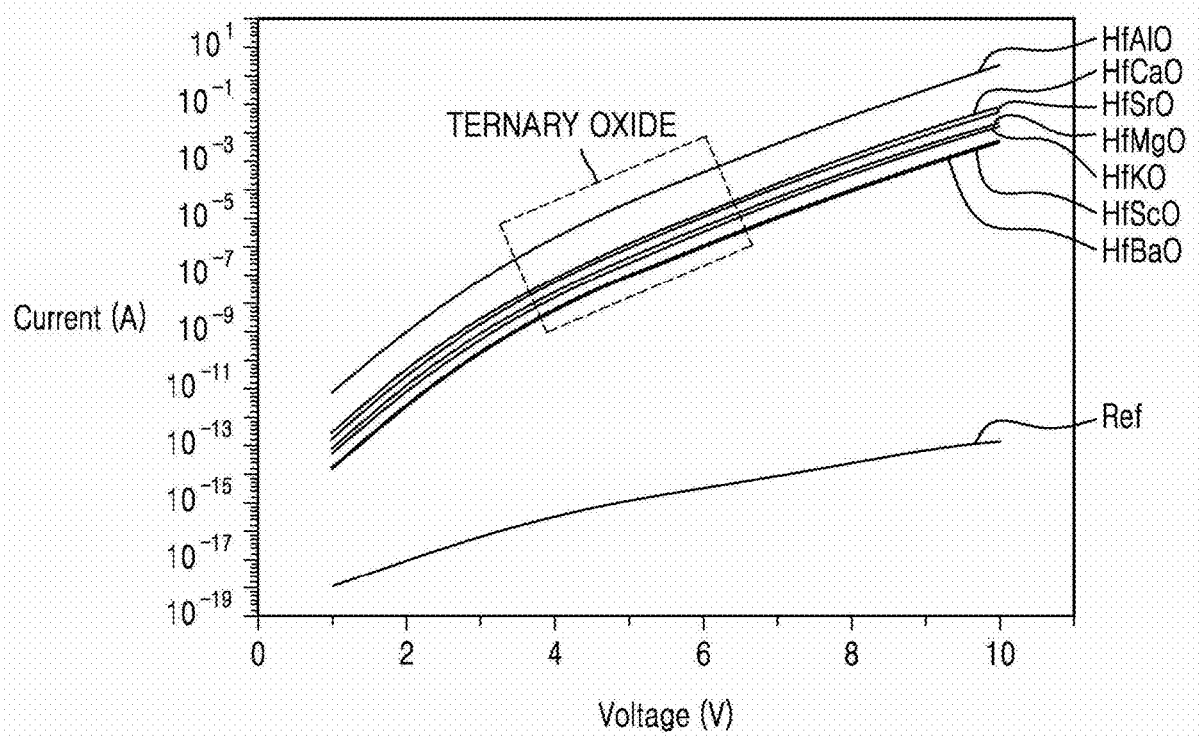

FIGS. 7A to 7C show computational simulation results for Vo formation energy, trap depth, and I-V curve for a variable resistance layer including various types of metal oxides.

FIG. 7A illustrates oxygen vacancy formation energy. In the graph, a comparative example is expressed as Ref, and refers to a case where a variable resistance layer is $SiO_2$/$HfO_2$, and the following representations of metal elements (M) indicate a case where a variable resistance layer is $SiO_2$/HfMO. M includes B, Mg, Al, K, Ca, Sc, Sr, Y, Ba, and La.

As the oxygen vacancy formation energy (Vo formation energy) has a positively (+) high value, the state is unstable, and thus, it may be seen that it is difficult to form oxygen vacancies well or to maintain the formed oxygen vacancies well.

Thus, it is expected that the higher the oxygen vacancy formation energy, the higher the set voltage $V_{set}$ that allows a variable resistance layer to be changed from a high-resistive state to a low-resistive state. In contrast, as the oxygen vacancy formation energy is negatively (−) low, the state is stable, and oxygen vacancies may be well formed or the formed oxygen vacancies may be well maintained, and thus, it is expected that the set voltage $V_{set}$ decreases.

As shown in the graph, an oxygen vacancy formation energy is lower in all cases where a ternary metal oxide is used for a variable resistance layer than in the case of the comparative example (Ref) in which $HfO_2$ is used, and thus, it may be confirmed that a ternary metal oxide may be usefully applied to reduce a set voltage.

FIG. 7B illustrates a trap depth. Also in the graph of FIG. 7B, the comparative example is expressed as Ref, and refers to a case where a variable resistance layer is $SiO_2$/$HfO_2$, and the following representations of metal elements (M) indicate a case where a variable resistance layer is $SiO_2$/HfMO. M includes B, Mg, Al, K, Ca, Sc, Sr, Y, Ba, and La.

The trap depth is defined as $\varphi_T$ in the following formula.

$$J = q\mu N_C E \exp\left(\frac{-q(\phi_T - \sqrt{qE/\pi\varepsilon})}{kT}\right)$$

Here, J refers to current density, q refers to unit quantity of electric charge, μ refers to mobility, E refers to electric field, $N_c$ refers to state density in a conduction band, k refers to Boltzmann constant, T refers to absolute temperature, and ε refers to permittivity.

The trap depth denotes a difference between trap level and conduction band minimum in the band diagram. When the trap depth is small, electrons at the trap level may move well to the conduction band, and when moving to the conduction band, the electrons may freely move, and thus, the current density may be increased. The smaller the trap depth, the higher the probability that electrons may ascend to the conduction band. Meanwhile, the trap density described above is the number of traps per unit volume of a variable resistance material, and the higher the trap density, the greater the number of electrons that may ascend over the conduction band.

Therefore, when the trap density is large and the trap depth is small, it is advantageous to improve the current density. In addition, it is expected that the smaller the trap depth, the greater the current ratio, $I_{ON}/I_{OFF}$, corresponding to a ratio of a high resistance to a low resistance.

As shown in the graph, the trap depth is smaller in all cases where a ternary metal oxide is used for a variable resistance layer than in the case of the comparative example (Ref) in which $HfO_2$ is used, and thus, it may be confirmed that a ternary metal oxide may be usefully applied to increase an on-off current ratio.

FIG. 7C illustrates an I-V curve. Also in the graph of FIG. 7C, the comparative example is expressed as Ref, and refers to a case where a variable resistance layer is $SiO_2/HfO_2$, and the following representations of metal oxides (HfMO) indicate a case where a variable resistance layer is $SiO_2/HfMO$. In order from top to bottom, M refers to Al, Ca, Sr, Mg, K, Sc, and Ba.

The shown I-V curve is an I-V curve after oxygen vacancies are formed in a variable resistance layer and corresponds to a case where a low-resistive state is reached. It may be seen that a graph representing high current represents a high on-off current ratio, and from the graph, it may be seen that an on-off current ratio is higher in all cases where a ternary metal oxide is used for a variable resistance layer than in the case of the comparative example (Ref) in which $HfO_2$ is used.

The energy required to form oxygen vacancies may be seen as oxygen vacancy formation energy, and when a voltage is applied to a variable resistance layer, atoms obtain energy, and oxygen vacancies may be formed. Thus, when the oxygen vacancy formation energy is low, oxygen vacancies may be formed even at a low voltage, thereby reducing a set voltage. Therefore, it is expected that a set voltage is lower in all cases where a ternary metal oxide is used for a variable resistance layer than in the case of the comparative example (Ref) in which $HfO_2$ is used.

As such, lowering the set voltage and increasing the on-off current ratio may contribute to low power consumption and improvement in integration density, and for this, a ternary metal oxide provided in a variable resistance layer may be selected for the variable resistance layer to have a low Vo formation energy and a low trap depth.

For example, referring to FIGS. 7A to 7C, a ternary metal oxide employed in a variable resistance layer may be selected so that the variable resistance layer is less than or equal to 1 eV or less than or equal to 0.8 eV.

Hereinafter, variable resistance memory devices of various examples to which such variable resistance layer is applied will be described.

Figure 8A:
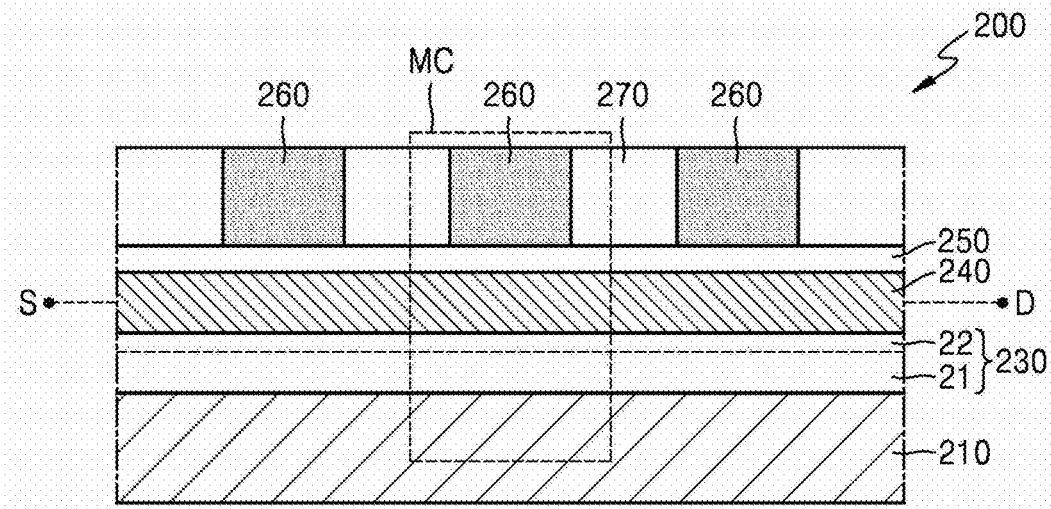
FIG. 8A is a cross-sectional view showing a schematic configuration of a variable resistance memory device according to another embodiment.
Figure 8B:
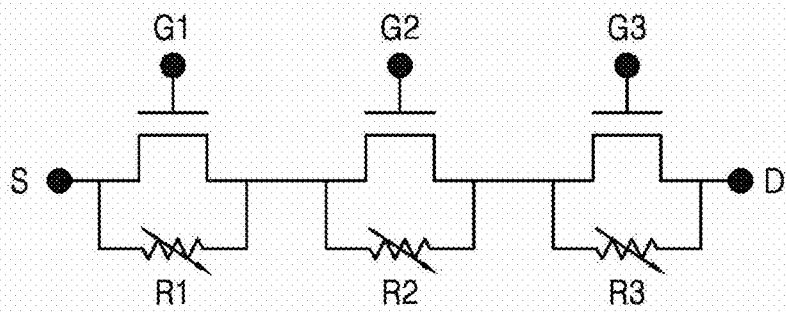
FIG. 8B illustrates an equivalent circuit of the variable resistance memory device of FIG. 8A according to an embodiment.
Figure 9:
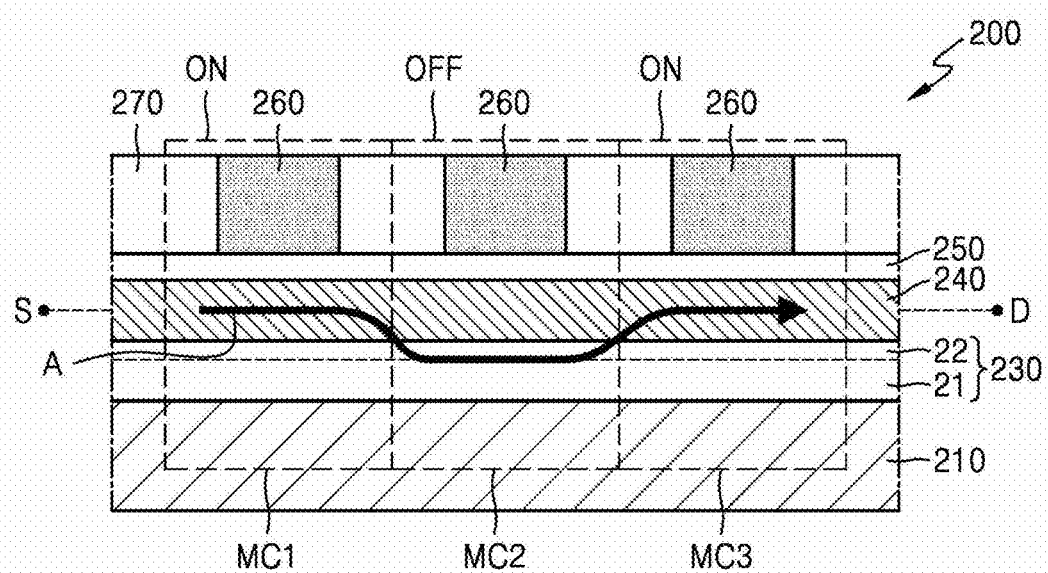
FIG. 9 is a conceptual diagram describing an example of an operation of the variable resistance memory device of FIG. 8A.

FIG. 8A is a cross-sectional view showing a schematic configuration of a variable resistance memory device according to another embodiment, and FIG. 8B illustrates an equivalent circuit of the variable resistance memory device of FIG. 8A. FIG. 9 is a conceptual diagram describing an example of an operation of the variable resistance memory device of FIG. 8A.

Referring to FIG. 8A, a variable resistance memory device 200 includes an insulating layer 210 (also referred to as a substrate 210), a variable resistance layer 230 disposed on the insulating layer 210, a channel layer 240 disposed on the variable resistance layer 230, a gate insulating layer 250 disposed on the channel layer 240, and a plurality of gate electrodes 260 formed on the gate insulating layer 250. An insulator 270 may be provided in a space between the plurality of gate electrodes 260 to separate adjacent gate electrodes 260. However, the variable resistance memory device 200 is merely an example, and the insulator 270 may be omitted.

Referring to FIG. 7, the variable resistance layer 230 includes a first layer 21 including a first material and a second layer 22 disposed on the first layer 21. The first layer 21 includes a ternary or more metal oxide including at least two metal materials (M1 and M2) having different valences. The second layer 22 includes an oxide. Materials in the variable resistance layer 230 and characteristics of the variable resistance layer 230 are substantially the same as those described for the variable resistance layer 130 of FIG. 1. In an oxide in which at least two metal materials having different valences are mixed, there are a plurality of oxygen vacancies $V_o$, and thus a conductive filament may be easily formed.

The channel layer 240 may include a semiconductor material. The second layer 22 may be in contact with the channel layer 240, and the second layer 22 may include an oxide of a material of the channel layer 240. For example, the channel layer 240 may include, for example, poly-Si, and the second layer 22 may include a silicon oxide ($SiO_2$) which is a native oxide due to poly-Si. The material of the channel layer 240 is not limited to poly-Si, and for example, may include various semiconductor materials such as Ge, IGZO, or GaAs. A native oxide material included in the second layer 22 may vary according to the material of the channel layer 240.

A source electrode S and a drain electrode D may be connected to opposite ends of the channel layer 240. The source electrode S may be referred to as a source S and the drain electrode D may be referred to as a drain D.

The gate insulating layer 250 may include various kinds of insulating materials. For example, a silicon oxide, a silicon nitride, or a silicon oxynitride may be used for the gate insulating layer 250.

A voltage for turning on/off the channel layer 240 may be selectively applied to each of the plurality of gate electrodes 260.

The variable resistance memory device 200 has a structure in which a plurality of memory cells MC are arrayed, and each of the plurality of the memory cells MC may have a transistor and a variable resistor connected in parallel as shown in the equivalent circuit of FIG. 8B. Each variable resistance is set by a voltage applied to a gate electrode and a voltage between the source electrode S and the drain electrode D and is a value corresponding to information of 1 or 0.

An operation of the variable resistance memory device 200 will be described with reference to FIG. 9.

When a memory cell to be written is selected, a gate voltage value of the corresponding memory cell is adjusted so that a channel is not formed in the selected memory cell, that is, the channel is turned off, and gate voltage values of unselected memory cells are adjusted so that channels in the unselected memory cells are turned on.

FIG. 9 illustrates a case in which a gate voltage is applied to a gate electrode 260 in each memory cell so that a memory cell MC2 at a center is turned off (OFF) and two memory cells MC1 and MC3 at opposite sides of the memory cell MC2 are turned on (ON). When a voltage is applied between the source electrode S and the drain electrode D, a conductive path denoted by an arrow A is formed. Referring to FIG. 9 and Table 4 below, desired information of 1 or 0 may be written in the selected memory cell MC2 by setting the applied voltage as a value of $V_{set}$ or $V_{reset}$. Writing a 0, or changing the value in a selected memory cell from a 1 to a 0, also may be called an erase operation.

Similarly, in a read operation, read may be performed on a selected memory cell. That is, a gate electrode applied to each gate electrode 260 is adjusted so that the channel of the selected memory cell MC2 is turned off and the channels of the unselected memory cells MC1 and MC3 are turned on, and then an electric current flowing in the corresponding memory cell MC2 due to an applied voltage ($V_{read}$) between the source electrode S and the drain electrode D is measured to identify a memory cell state (1 or 0).

TABLE 4

|  | Write | Read |
| --- | --- | --- |
| Selected Gate | Voff | Voff |
| Unselected Gate | Von | Von |
| Selected Vsd | Vset or Vreset | Vread |

Figure 10:
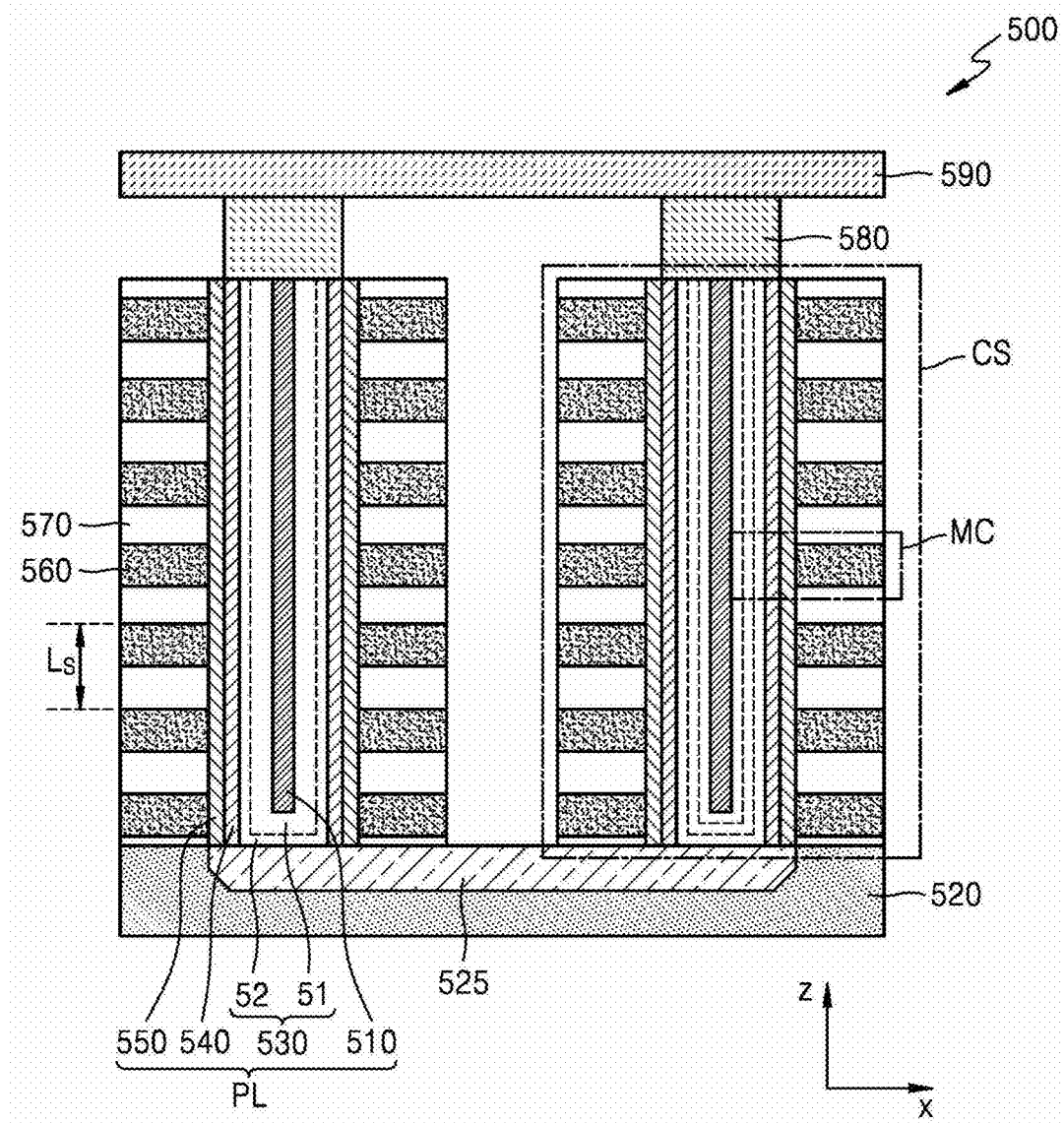
FIG. 10 is a cross-sectional view showing a schematic structure of a variable resistance memory device according to another embodiment.
Figure 11:
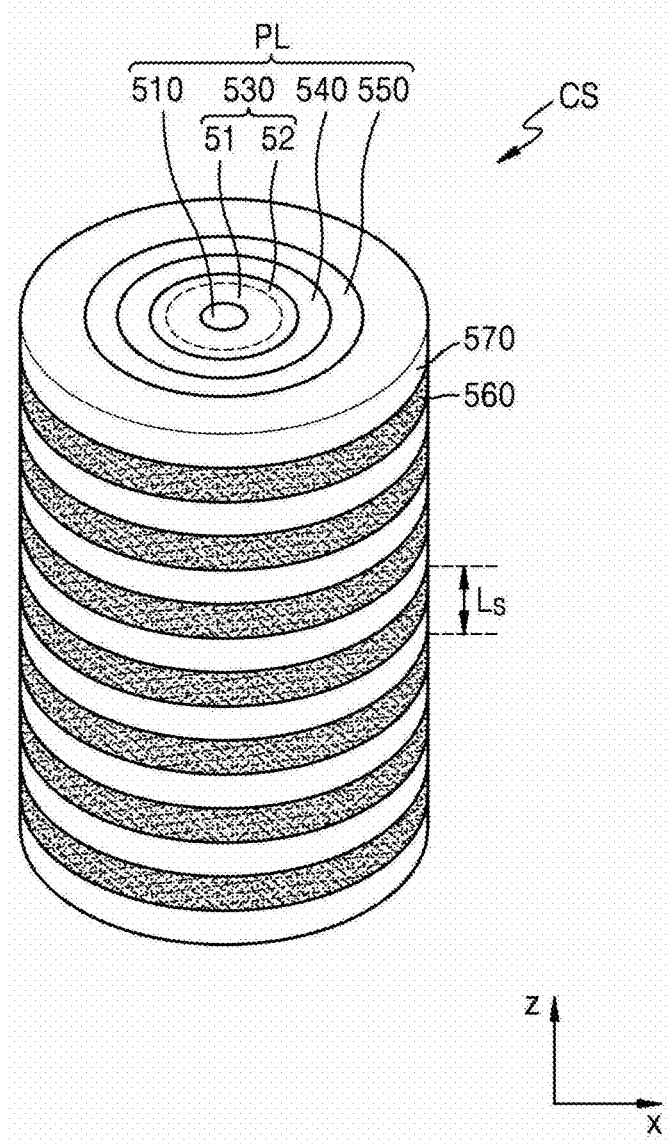
FIG. 11 is a perspective view showing a schematic view of a memory string provided in the variable resistance memory device of FIG. 10 according to an embodiment.
Figure 12:
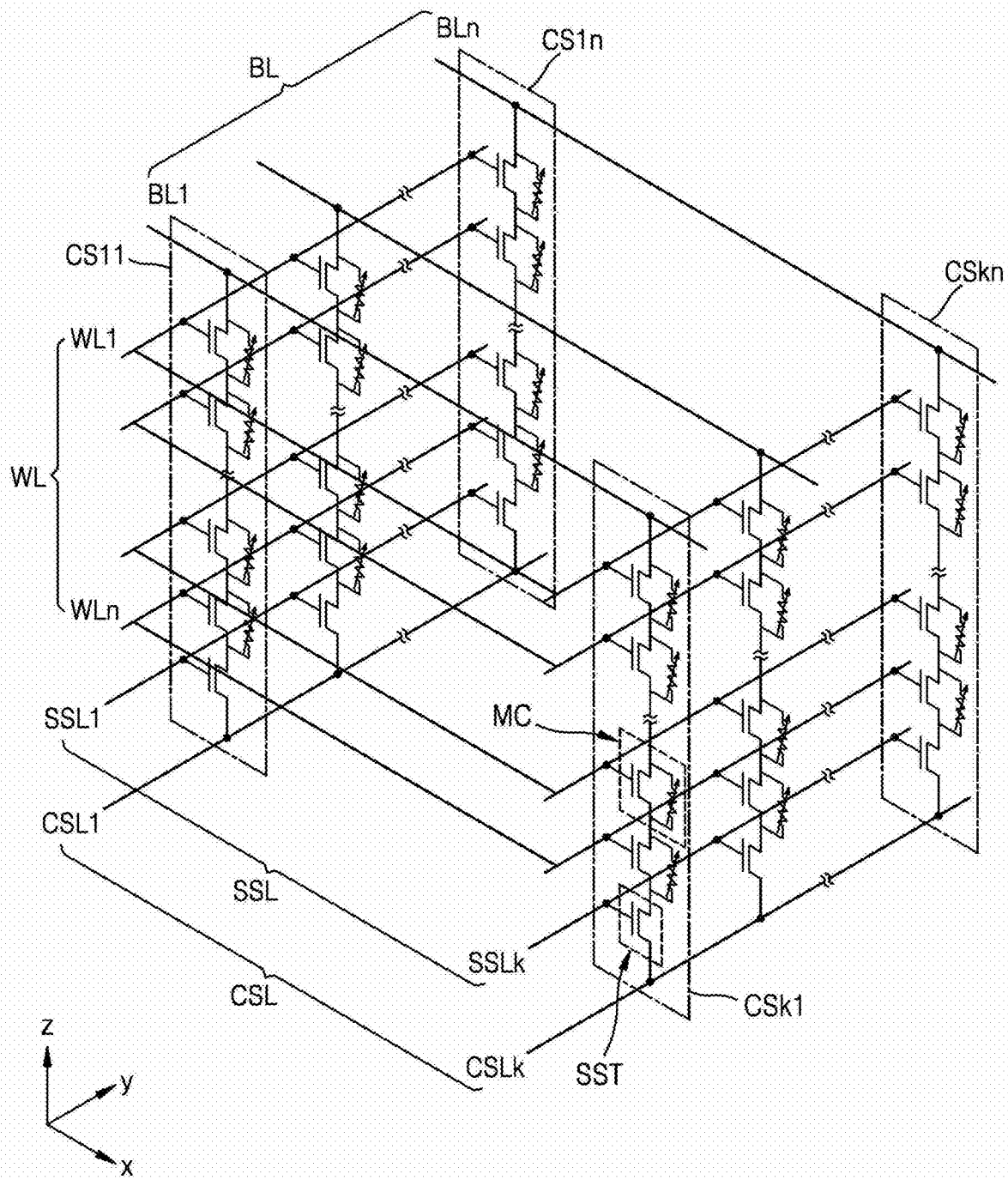
FIG. 12 is an equivalent circuit diagram of the variable resistance memory device of FIG. 10 according to an embodiment.

FIG. 10 is a cross-sectional view showing a schematic structure of a variable resistance memory device according to another embodiment, and FIG. 11 is a perspective view showing a schematic structure of a memory string provided in the variable resistance memory device of FIG. 10. FIG. 12 is an equivalent circuit diagram of the variable resistance memory device of FIG. 11.

A variable resistance memory device 500 of the present embodiment is a vertical NAND (VNAND) memory in which a plurality of memory cells MC including variable resistance material are arrayed in a vertical direction.

Referring to FIGS. 10 to 12, a detailed configuration of the variable resistance memory device 500 will be described below.

First, referring to FIG. 10, a plurality of cell strings CS are formed on a substrate 520.

The substrate 520 may include a silicon material doped with first type impurities. For example, the substrate 520 may include a silicon material doped with p-type impurities. For example, the substrate 520 may be a p-type well (for example, a pocket p-well). Hereinafter, it is assumed that the substrate 520 is p-type silicon.

However, the substrate 520 is not limited to the p-type silicon.

A doping region 525 as a source region is provided in the substrate 520. The doping region 525 may be of an n-type that is different from that of the substrate 520.

Hereinafter, it is assumed that the doping region 525 is of the n-type. However, the doping region 525 is not limited to the n-type. The doping region 525 may be connected to a common source line CSL. The doping region 525 may also be referred to as a source 525.

As shown in the circuit diagram of FIG. 12, there may be k*n cell strings CS that are arranged in a matrix form and may be each be referred to as CSij (1≤i≤k, 1≤j≤n) according to a position thereof in each row and column. Each of the cell strings CSij is connected to a bit line BL, a string select line SSL, a word line WL, and the common source line CSL.

Each of the cell strings CSij includes memory cells MC and a string select transistor SST. The memory cells MC and the string select transistor SST in each of the cell strings CSij may be stacked in a height direction.

A plurality of rows of the cell strings CS are connected to different string select lines SSL1 to SSLk, respectively. For example, string select transistors SST in cell strings CS11 to CS1n are commonly connected to a string select line SSL1. String select transistors SST in cell strings CSk1 to CSkn are commonly connected to a string select line SSLk.

A plurality of columns of the cell strings CS are connected to different bit lines BL1 to BLn, respectively. For example, memory cells MC and string select transistors SST in cell strings CS11 to CSk1 may be commonly connected to a bit line BL1, and memory cells MC and string select transistors SST in cell strings CS1n to CSkn may be commonly connected to a bit line BLn.

The plurality of rows of the cell strings CS may be connected to different common source lines CSL1 to CSLk, respectively. For example, the string select transistors SST in the cell strings CS11 to CS1n may be commonly connected to a common source line CSL1, and the string select transistors SST in the cell strings CSk1 to CSkn may be commonly connected to a common source line CSLk.

Gate electrodes of memory cells MC positioned at the same height from the substrate 520 or the string select transistors SST may be commonly connected to one word line WL, and gate electrodes of memory cells MC positioned at different heights from the substrate 520 or the string select transistors SST may be connected to different word lines WL1 to WLm, respectively.

The circuit structure shown in FIG. 12 is merely an example. For example, the number of rows of the cell strings CS may be increased or decreased. As the number of the rows of the cell strings CS varies, the number of string select lines connected to the rows of the cell strings CS and the number of cell strings CS connected to one bit line may also vary. As the number of rows of the cell strings CS varies, the number of common source lines connected to the rows of the cell strings CS may also vary.

The number of columns of cell strings CS may be increased or decreased. As the number of columns of the cell strings CS varies, the number of bit lines connected to the columns of the cell strings CS and the number of cell strings CS connected to one string select line may also vary.

The height of the cell strings CS may be increased or decreased. For example, the number of memory cells MC stacked in each of the cell strings CS may be increased or decreased. As the number of memory cells MC stacked in each of the cell strings CS varies, the number of word lines WL may also vary. For example, the number of string select transistors provided to each of the cell strings CS may be increased. As the number of the string select transistors provided to each of the cell strings CS varies, the number of string select lines or common source lines may also vary.

When the number of the string select transistors increases, the string select transistors may be stacked like the memory cells MC.

For example, write and read operations may be performed in units of rows of the cell strings CS. The cell strings CS may be selected by the common source line CSL in units of one row and may be selected by the string select lines SSL in units of one row. Also, the voltage may be applied to the common source lines CSL in units of at least two common source lines CSL. The voltage may be applied to the common source lines CSL in units of total common source lines CSL.

In a selected row of the cell strings CS, the write and read operations may be performed in units of pages. A page may denote one row of memory cells connected to one word line WL. In the selected row of the cell strings CS, the memory cells may be selected by word lines WL in units of pages.

As illustrated in FIG. 11, a cell string CS includes a pillar PL having a cylindrical shape and a plurality of gate electrodes 560 and a plurality of insulators 570 which surround the pillar PL in a ring shape. Each of the plurality of insulators 570 separates between the plurality of gate electrodes 560, and each of the plurality of the gate electrodes 560 and the plurality of insulators 570 may be alternately stacked in a vertical direction (Z direction). The pillar PL having a cylindrical shape includes an insulating layer 510 extending in the vertical direction and having a cylindrical shape, and a variable resistance layer 530, a channel layer 540, and a gate insulating layer 550 sequentially surrounding the insulating layer 510 in a cylindrical shell shape.

The gate electrode 560 may include a metal material or a silicon material doped at a high concentration. Each gate electrode 560 is connected to one of the word line WL and the string select line SSL.

The insulator 570 may include various insulating materials such as a silicon oxide or a silicon nitride.

The pillar PL may include a plurality of layers. An outermost layer of the pillar PL may be the gate insulating layer 550. For example, the gate insulating layer 550 may include various insulating materials such as silicon oxide, silicon nitride, or silicon oxynitride. The gate insulating layer 550 may be conformally deposited on the pillar PL.

The channel layer 540 may be conformally deposited along an inner surface of the gate insulating layer 550. The channel layer 540 may include a semiconductor material doped with a first type dopant. The channel layer 540 may include a silicon material doped with the same type as that of the substrate 520, and for example, when the substrate 520 includes a silicon material doped as p-type, the channel layer 540 may also include the silicon material doped as the p-type. Alternatively, the channel layer 540 may include a material such as Ge, IGZO, or GaAs.

The variable resistance layer 530 may be disposed along an inner surface of the channel layer 540. The variable resistance layer 530 may be disposed to contact the channel layer 540 and may be conformally deposited on the channel layer 540.

The variable resistance layer 530 changes to a high-resistive state or a low-resistive state according to a voltage applied thereto, and includes a first layer 51 and a second layer 52, the first layer 51 including a metal oxide containing at least two metal materials having different valences and the second layer 52 including a silicon oxide.

Materials in the variable resistance layer 530 and characteristics of the variable resistance layer 530 are substantially the same as those described for the variable resistance layer 130. A metal oxide having a ternary system or more complex multicomponent system including two metal materials (M1 and M2) having different valences may be included in the first layer 51. M1 and M2 may each include an oxide having a band gap energy of 2 eV or more, for example, Rb, Ti, Ba, Zr, Ca, Hf, Sr, Sc, B, Mg, Al, K, Y, La, Si, Be, Nb, Ni, Ta, W, V, La, Gd, Cu, Mo, Cr, or Mn. A metal oxide (M1-M2-O) included in the first layer 51 may be Al—Ti—O, Hf—Al—O, Hf—Mg—O, Hf—K—O, Hf—Ca—O, Hf—Sc—O, Hf—Sr—O, Hf—Ba—O, Hf—B—O, Hf—Y—O, Hf—La—O, Al—Zr—O, Al—Si—O, Mg—Si—O, Mg—Zr—O, Zr—Nb—O, Hf—Nb—O, or Hf—Ta—O.

The variable resistance memory device 500 includes the variable resistance layer 530, in which oxygen vacancies are easily formed, thereby allowing a difference between a resistance value of a high-resistive state and a resistance value of a low-resistive state to be increased. Accordingly, the variable resistance memory device 500 may have characteristics of low set voltage and low reset voltage.

The insulating layer 510 may be deposited along an inner surface of the variable resistance layer 530. The insulating layer 510 may fill the innermost space of the pillar PL.

The channel layer 540 and the variable resistance layer 530 may contact the doping region 525, that is, a common source region.

A drain region 580 may be provided on the pillar PL of the cell string CS. The drain region 580 may include a silicon material doped with second type dopants. For example, the drain region 580 may include a silicon material doped as n-type. The drain region 580 may also be referred to as a drain structure 580.

A bit line 590 may be provided on the drain region 580. The drain region 580 and the bit line 590 may be connected to each other via contact plugs.

Each of the gate electrodes 560 and regions in the gate insulating layer 550, the channel layer 540, and the variable resistance layer 530, the regions facing each of the gate electrodes 560 in a horizontal direction (X direction), configure the memory cell MC. That is, the memory cell MC has a circuit structure in which a transistor including the gate electrode 560, the gate insulating layer 550, and the channel layer 540 and a variable resistor provided by the variable resistance layer 530 are connected in parallel.

The above parallel connection structure is continuously arranged in the vertical direction (Z direction) to form the cell string CS. In addition, opposite ends of the cell string CS may be connected to the common source line CSL and the bit line BL, as shown in the circuit diagram of FIG. 12. When the voltage is applied to the common source line CSL and the bit line BL, the programming, read, and erase operations may be performed on the plurality of memory cells MC.

For example, referring to FIG. 12 and Table 5 below, when a memory cell MC to be written is selected, a gate voltage value of the corresponding memory cell is adjusted through a selected word line so that a channel is not formed in the selected memory cell, that is, the channel is turned off, and gate voltage values of unselected memory cells are adjusted through unselected word lines so that channels in the unselected memory cells are turned on. Accordingly, a current path formed by the voltage applied to the common source line CSL and the bit line BL passes through the region of the variable resistance layer 530 in the selected memory cell MC. At this time, a low-resistive state or a high-resistive state may be obtained by setting the applied voltage as a $V_{set}$ value or a $V_{reset}$ value, and desired information of 1 or 0 may be written in the selected memory cell MC. Writing a 0, or changing the value in a selected memory cell from a 1 to a 0, also may be called an erase operation.

In a reading operation, reading of the selected memory cell may be performed similarly as above. That is, a gate voltage applied to each gate electrode 560 is adjusted so that the channel of the selected memory cell MC is turned off and the channels of the unselected memory cells MC are turned on, and then an electric current flowing in the corresponding memory cell MC due to an applied voltage ($V_{read}$) between the common source line CSL and the bit line BL is measured to identify a memory cell state (1 or 0).

TABLE 5

|  | Write | Read |
| --- | --- | --- |
| Selected WL | Voff | Voff |
| Unselected WL | Von | Von |
| Between selected BL and CSL | Vset or Vreset | Vread |
| Between unselected BL and CSL | Float | Float |
| Selected SSL | Von | Von |
| Unselected SSL | Voff | Voff |

As described above, the variable resistance memory device 500 according to embodiments configures the memory cells MC to include the variable resistance layer 530, in which a conductive filament is easily formed due to oxygen vacancies, and forms a memory element by arranging the memory cells MC. Therefore, the variable resistance layer 530 may be relatively thinner than a memory element with a conventional structure, for example, a phase change material-based memory element or a charge trapping-based memory element, and the variable resistance memory device 500 may have a low operating voltage.

In the above VNAND structure, due to packaging limitation according to a height of the cell string CS, there is a limit to increase the number of the gate electrodes 560 included in the cell string CS. Furthermore, in a case of the charge trapping-based memory device, there is a limit to reduce a distance between adjacent gate electrodes 560 due to interference. For example, it is known that it is difficult to reduce a sum $L_s$ of vertical lengths of the gate electrode 560 and the insulator 570 adjacent to each other in the vertical direction (Z direction) to be less than or equal to about 38 nm, and thus the memory capacity is limited.

In the variable resistance memory device 500 according to an embodiment, the sum $L_s$ of the lengths of the gate electrode 560 and the insulator 570 adjacent to each other in the vertical direction (Z direction) may be reduced and/or minimized using the variable resistance layer 530. In an embodiment, the length may be reduced to be less than or equal to about 20 nm, for example, about 15 nm, and in this case, the memory capacity may be doubled or more.

The variable resistance memory device 500 may address a scaling issue between memory cells in a next-generation VNAND, thereby increasing a density and implementing a low-power consumption.

The variable resistance memory devices 100, 200, and 500 according to embodiments of the disclosure may be employed as memory systems of various electronic devices. The variable resistance memory device 500 may be implemented as a chip-type memory block to be used as a neuromorphic computing platform or used to construct a neural network.

Figure 13:
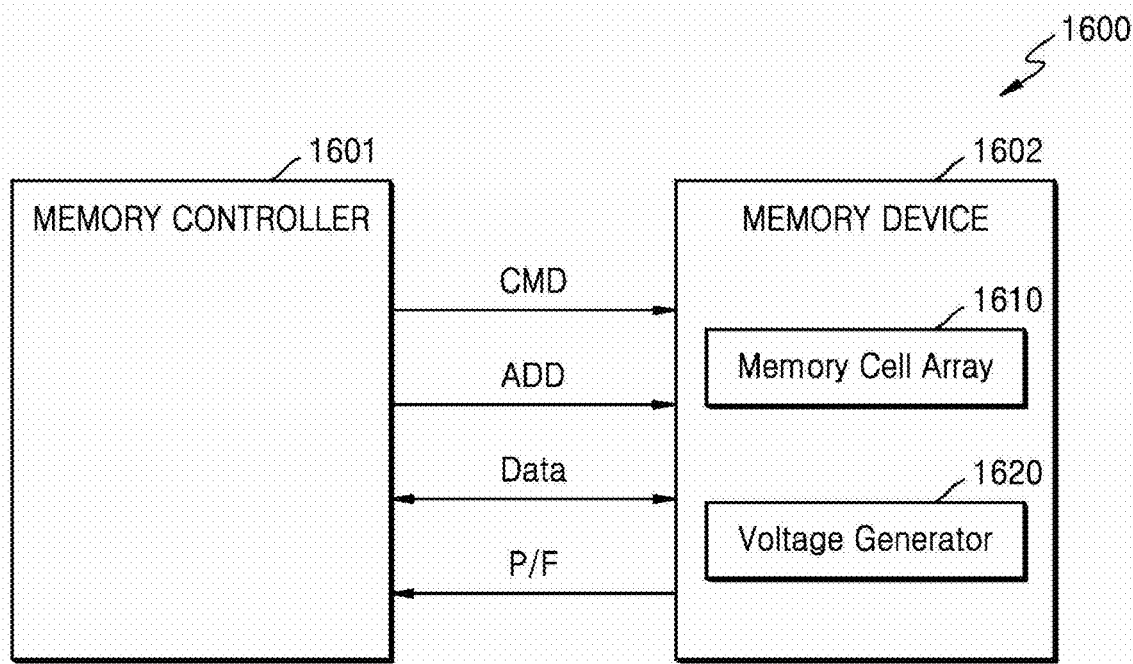
FIG. 13 is a block diagram of a memory system according to an embodiment.

FIG. 13 is a block diagram of a memory system according to an embodiment.

Referring to FIG. 13, a memory system 1600 may include a memory controller 1601 and a memory device 1602. The memory controller 1601 performs a control operation on the memory device 1602. For example, the memory controller 1601 provides, to the memory device 1602, an address ADD and a command CMD for performing programming (or write), read, and/or erase operations on the memory device 1602. In addition, data for a programing operation and read data may be transmitted between the memory controller 1601 and the memory device 1602.

The memory device 1602 may include a memory cell array 1610 and a voltage generator 1620. The memory cell array 1610 may include a plurality of memory cells arranged in regions where a plurality of word lines and a plurality of bit lines cross each other. The memory cell array 1610 may include a variable resistance memory device based on the embodiments of FIGS. 1, 8A, and 10.

The memory controller 1601 may include a processing circuitry such as a hardware including a logic circuit; a hardware/software combination such as processor execution software; or a combination thereof. Examples of the processing circuitry may include a central processing unit (CPU), an arithmetic logic unit (ALU), a digital signal processor, a microcomputer, a field-programmable gate array (FPGA), a system-on-chip (SoC), a programmable logic unit, a microprocessor, and an application-specific integrated circuit (ASIC), but is not limited thereto. The memory controller 1601 may operate in response to a request from a host (not shown), and may be configured to be changed into a special purpose controller by accessing to the memory device 1602 and controlling a control operation (for example, a write/read operation) discussed above. The memory controller 1601 may generate an address ADD and a command CMD for performing a programming/read/erase operation on the memory cell array 1610. In addition, in response to a command from the memory controller 1601, the voltage generator 1620 (for example, a power circuit) may generate a voltage control signal for controlling a voltage level of a word line for the sake of data programming or data read in the memory cell array 1610.

In addition, the memory controller 1601 may perform a determination operation on the data read from the non-volatile memory device 1602. For example, the number of on-cells and/or the number of off-cells may be determined from data read from a memory cell. The memory device 1602 may provide a pass/fail signal P/F to the memory controller 1601 according to a result of reading the read data. The memory controller 1601 may control write and read operations of the memory cell array 1610 with reference to the pass/fail signal P/F.

Figure 14:
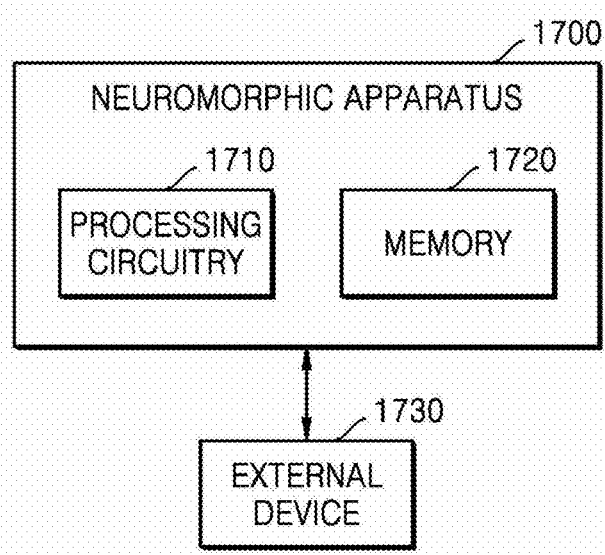
FIG. 14 is a block diagram showing a neuromorphic apparatus and an external device connected thereto, according to an embodiment.

FIG. 14 is a block diagram showing a neuromorphic apparatus and an external device connected thereto, according to an embodiment.

Referring to FIG. 14, a neuromorphic apparatus 1700 may include a processing circuitry 1710 and/or a memory 1720. The neuromorphic apparatus 1700 may include a variable resistance memory device based on the embodiments of FIGS. 1, 8A, and 10.

In some examples embodiments, the processing circuitry 1710 may be configured to control a function for driving the neuromorphic apparatus 1700. For example, the processing circuitry 1710 may be configured to control the neuromorphic apparatus 1700 by executing a program stored in the memory 1720. In some examples embodiments, the processing circuitry 1710 may include a hardware such as a logic circuit, a hardware/software combination such as a processor configured to execute software, or a combination thereof. For example, the processor may include a CPU, a graphics processing unit (GPU), an application processor (AP) included in the neuromorphic apparatus 1700, an ALU, a digital signal processor, a microcomputer, a FPGA, a SoC, a programmable logic unit, a microprocessor, and an ASIC, but is not limited thereto. In some examples embodiments, the processing circuitry 1710 may read/write various data with respect to an external device 1730, and/or may be configured to execute the neuromorphic apparatus 1700 using the read/written data. In some embodiments, the external device 1730 may include an external memory and/or a sensor array, each having an image sensor (for example, a complementary metal-oxide-semiconductor (CMOS) image sensor circuit).

In some embodiments, the neuromorphic apparatus 1700 of FIG. 14 may be applied to a machine learning system. The machine learning system may use various artificial neural network organizing and processing models such as a convolutional neural network (CNN), a deconvolutional neural network, a recurrent neural network (RNN) including a long short-term memory (LSTM) unit and/or a gated recurrent unit (GRU), a stacked neural network (SNN), a state-space dynamic neural network (SSDNN), a deep faith network (DBN), a generative adversarial network, and/or a restricted Boltzmann machine (RBM).

Alternatively or additionally, the machine learning system may include other forms of machine learning models, for example, linear and/or logistic regression, statistical clustering, Bayesian classification, decision tree, dimensionality reduction such as principal component analysis, an expert system, and/or a combination thereof including ensembles such as random forests. These machine learning models may be used to provide various services and/or applications. For example, an image classification service, a user authentication service based on biometrics or biometric data, an advanced driver assistance system (ADAS), a voice assistant service, or an automatic speech recognition (ASR) service may be executed by an electronic device.

In the variable resistance memory device, a resistance variation may occur under a low applied voltage.

The variable resistance memory device may have a wide range of resistance variation.

The variable resistance memory device may easily implement low power consumption and high integration density.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A variable resistance memory device comprising:
    a variable resistance layer including a first layer and a second layer on the first layer, the first layer including a ternary or more metal oxide containing two or more metal materials having different valences, and the second layer including an oxide;
    a first conductive element on the variable resistance layer; and
    a second conductive element on the variable resistance layer and spaced apart from the first conductive element,
    the first conductive element and the second conductive element, in response to an applied voltage, being configured to form a current path in a direction perpendicular to a direction in which the first layer and the second layer are stacked.

2. The variable resistance memory device of claim 1, wherein the first conductive element and the second conductive element contact the second layer.

3. The variable resistance memory device of claim 1, wherein the second layer includes a silicon oxide.

4. The variable resistance memory device of claim 1, wherein the metal oxide includes Rb, Ti, Ba, Zr, Ca, Hf, Sr, Sc, B, Mg, Al, K, Y, La, Si, Be, Nb, Ni, Ta, W, V, La, Gd, Cu, Mo, Cr, or Mn.

5. The variable resistance memory device of claim 1, wherein the metal oxide is represented by $(M1)_x(M2)_yO_z$, M1 and M2 are each a metal element, a valance of M1 is greater than that of M2, and $x \geq y$ is satisfied.

6. The variable resistance memory device of claim 1, wherein the metal oxide includes AlTiO, HfAlO, HfMgO, HfKO, HfCaO, HfScO, HfSrO, HfBaO, HfBO, HfYO, HfLaO, AlZrO, AlSiO, MgSiO, MgZrO, ZrNbO, HfNbO, or HfTaO.

7. The variable resistance memory device of claim 1, wherein the metal oxide is HfAlO, HfMgO, HfKO, HfCaO, HfScO, HfSrO, or HfBaO.

8. The variable resistance memory device of claim 1, wherein the two or more metal materials included in the metal oxide are selected so that a trap depth of the variable resistance layer is less than 1 eV.

9. The variable resistance memory device of claim 1, wherein a thickness of the first layer is less than or equal to about 100 nm.

10. The variable resistance memory device of claim 1, wherein a thickness of the first layer is in a range of about 1 nm to about 10 nm.

11. The variable resistance memory device of claim 1, wherein a thickness of the second layer is less than or equal to about 5 nm.

12. A variable resistance memory device comprising:
    an insulating layer;
    a variable resistance layer on the insulating layer, the variable resistance layer including a first layer and a second layer on the first layer,
    the first layer including a ternary or more metal oxide containing two or more metal materials having different valences, and the second layer including an oxide;
    a channel layer on the variable resistance layer;
    a gate insulating layer on the channel layer; and
    a plurality of gate electrodes and a plurality of insulators which are alternately and repeatedly disposed on the gate insulating layer in a first direction parallel to the channel layer.

13. The variable resistance memory device of claim 12, wherein the second layer is in contact with the channel layer, and the oxide included in the second layer is an oxide of a material of the channel layer.

14. The variable resistance memory device of claim 12, wherein the channel layer includes polysilicon (poly-Si), and the second layer includes a silicon oxide.

15. The variable resistance memory device of claim 8, wherein the metal oxide includes Rb, Ti, Ba, Zr, Ca, Hf, Sr, Sc, Mg, Al, Si, Be, Nb, Ni, Ta, W, V, La, Gd, Cu, Mo, Cr, or Mn.

16. The variable resistance memory device of claim 12, wherein the metal oxide is represented by $(M1)_x(M2)_yO_z$, M1 and M2 are each a metal element, a valance of M1 is greater than that of M2, and x≥y is satisfied.

17. The variable resistance memory device of claim 12, wherein the metal oxide includes AlTiO, HfAlO, HfMgO, HfKO, HfCaO, HfScO, HfSrO, HfBaO, HfBO, HfYO, HfLaO, AlZrO, AlSiO, MgSiO, MgZrO, ZrNbO, HfNbO, or HfTaO.

18. The variable resistance memory device of claim 12, wherein the metal oxide is HfAlO, HfMgO, HfKO, HfCaO, HfScO, HfSrO, or, HfBaO.

19. The variable resistance memory device of claim 12, wherein the two or more metal materials included in the metal oxide are selected so that a trap depth of the variable resistance layer is less than 1 eV.

20. The variable resistance memory device of claim 12, wherein a thickness of the first layer is less than or equal to about 100 nm.

21. The variable resistance memory device of claim 12, wherein a thickness of the first layer ranges from about 1 nm to about 10 nm.

22. The variable resistance memory device of claim 12, wherein a thickness of the second layer is less than or equal to about 5 nm.

23. The variable resistance memory device of claim 12, wherein the insulating layer has a cylindrical shape extending in the first direction, the variable resistance layer, the channel layer, and the gate insulating layer sequentially surround the insulating layer to provide a cylinder-shell shape, and the plurality of gate electrodes and the plurality of insulators surround the gate insulating layer alternately in the first direction.

24. The variable resistance memory device of claim 23, wherein a sum of lengths of a gate electrode and an insulator in the first direction, which are disposed adjacent to each other among the plurality of gate electrodes and the plurality of insulators, is less than about 20 nm.

25. The variable resistance memory device of claim 24, further comprising:

a drain region and a source region contacting opposite end portions of the channel layer and the variable resistance layer in the first direction, respectively.

26. The variable resistance memory device of claim 25, further comprising:

a bit line connected to the drain region;

a source line connected to the source region; and a plurality of word lines connected to the plurality of gate electrodes, respectively.

27. An electronic device, comprising:

the variable resistance memory device of claim 12.

* * * * *